United States Patent [19]
Moody et al.

[11] Patent Number: 5,650,719
[45] Date of Patent: Jul. 22, 1997

[54] DETECTION OF PASSING MAGNETIC ARTICLES WHILE PERIODICALLY ADAPTING DETECTION THRESHOLDS TO CHANGING AMPLITUDES OF THE MAGNETIC FIELD

[75] Inventors: Kristann L. Moody, Barrington; Ravi Vig, Bow; P. Karl Scheller, Rochester; Jay M. Towne, Andover; Teri L. Tu, Bow, all of N.H.

[73] Assignee: Allegro Microsystems, Inc., Worcester, Mass.

[21] Appl. No.: 587,407

[22] Filed: Jan. 17, 1996

[51] Int. Cl.⁶ .................. G01P 3/48; G01P 3/489
[52] U.S. Cl. .................. 324/166; 324/207.2
[58] Field of Search .................. 324/173, 174, 324/166, 160, 163, 207.12, 207.2, 207.21, 207.22–207.26, 251, 252; 338/32 R, 32 H; 327/510, 511; 364/565

[56] References Cited

U.S. PATENT DOCUMENTS

| | | | |
|---|---|---|---|
| 4,293,814 | 10/1981 | Boyer | 324/166 |
| 4,367,721 | 1/1983 | Boyer | 123/617 |
| 5,291,133 | 3/1994 | Gokhale et al. | 324/207.25 |
| 5,442,283 | 8/1995 | Vig et al. | 324/207 |
| 5,459,398 | 10/1995 | Hansen et al. | 324/166 |
| 5,477,142 | 12/1995 | Good et al. | 324/166 |
| 5,493,219 | 2/1996 | Makino et al. | 324/207.25 |
| 5,497,084 | 3/1996 | Bicking | 324/166 X |
| 5,510,706 | 4/1996 | Good | 324/166 |

OTHER PUBLICATIONS

An Engineering Approach to Digital Design, William I. Fletcher, pp. 14–19, Prentice Hall, Inc., 1980.
Data Acquisition and Conversion Handbook; pp. 16–17, Datel–Intersil, Inc.; Mansfield, Massachusetts; 1980.

*Primary Examiner*—Sandra L. O'Shea
*Assistant Examiner*—Roger C. Phillips

[57] ABSTRACT

A Hall transducer produces a signal Vsig. Threshold voltages $V_{Pth}$ and $V_{Nth}$ are generated at the beginning, $t_{update}$, of each of a succession of update time intervals, of 64 pulses in Vsig, to be fixed percentages respectively of the peak to peak voltage in Vsig. A proximity-detector binary output voltage is high when Vsig exceeds threshold voltage $V_{Pth}$ and low when Vsig is below threshold voltage $V_{Nth}$. Signals $V_{Pold}$ and $V_{Nold}$, generated by first and second DACs, are equal to the first positive and negative peaks in Vsig after each time $t_{update}$ initiating the start of a successive interval. Signals $V_{Pnew}$ and $V_{Nnew}$, simultaneously generated by third and fourth DACs, are equal to the greatest positive and negative peak voltages in Vsig during the interval ending at $t_{update}$. Counters present their count to the first and second DACs that count pulses from a clock for tracking and holding +/− peaks in Vsig. After each time $t_{update}$, a pulse in a signal Vupdt is generated if at time $t_{update}$ $V_{Nnew}$ lies outside the range. $V_{Nold}-\Delta v$ to $V_{Nold}+\Delta v$ of if $V_{Nnew}$ lies outside the range $V_{Nold}-\Delta v$ to $V_{Nold}+\Delta v$, where $\Delta v$ is an incremental DC bias voltage. Vupdt resets the counters so that during the succeeding update time interval the threshold voltages $V_{Pth}$ and $V_{Nth}$ have the fixed percentages of the updated threshold voltages $V_{Pnew}-V_{Nnew}$.

5 Claims, 3 Drawing Sheets

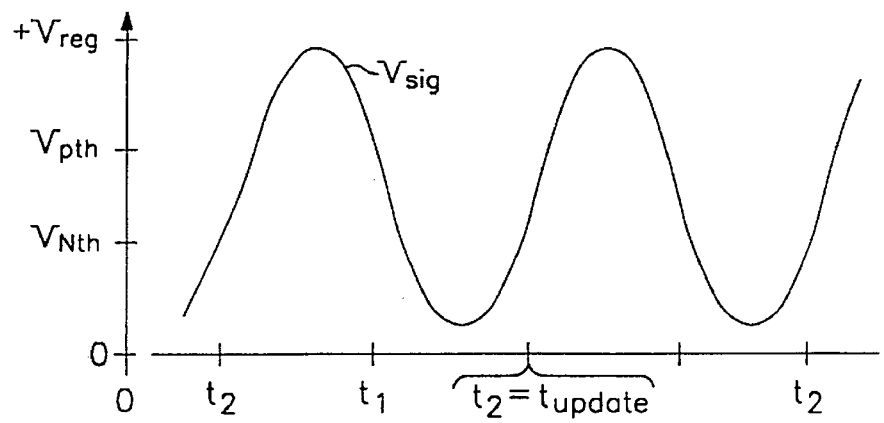
FIG. 6
FIG. 7 LATCH SIGNAL
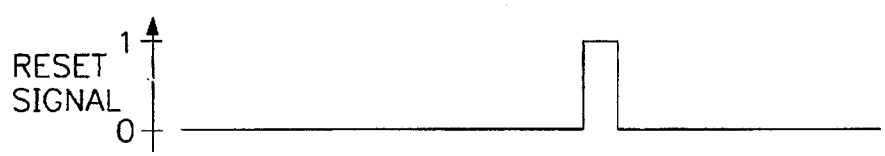
FIG. 8 RESET SIGNAL
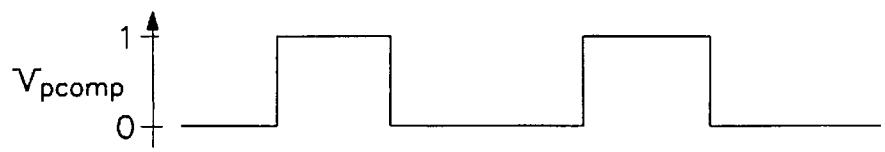
FIG. 9 $V_{pcomp}$
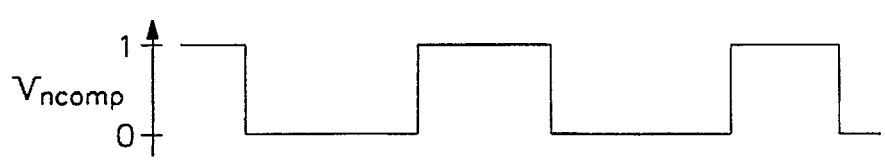
FIG. 10 $V_{ncomp}$
FIG. 11 $Q_{33b}$
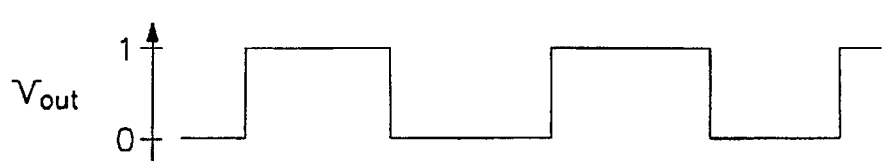
FIG. 12 $V_{out}$ 5,650,719

1

DETECTION OF PASSING MAGNETIC ARTICLES WHILE PERIODICALLY ADAPTING DETECTION THRESHOLDS TO CHANGING AMPLITUDES OF THE MAGNETIC FIELD

BACKGROUND

This invention relates to a proximity detector, and especially to a ferrous-gear-tooth Hall-transducer, or other magnetic-field-to-voltage transducer, capable of detecting the leading and trailing gear tooth edges of an adjacent rotating ferrous gear, or other magnetic articles, and more particularly relates to such a Hall sensor with detection thresholds that adapt to the peak to peak amplitude of the Hall voltage.

The term "magnetic" as used herein applies to magnetized bodies, ferrous bodies and other bodies having a low magnetic reluctance that tend to alter the ambient magnetic field.

In U.S. Pat. No. 5,442,283, issued Aug. 15, 1995 there is described a Hall-voltage slope-activated sensor capable of detecting the rising and falling edges of a gear tooth, which sensor includes a circuit for tracking a slope of a Hall voltage and briefly holding the ensuing peak voltage before producing a pulse signal indicating the onset of the following Hall-voltage slope of opposite direction. The Hall voltage holding circuit includes a capacitor and circuit means for controllably leaking charge out of or into the capacitor for preventing false tripping of a comparator that provides the pulse output signal. The holding voltage of the capacitor thus has a droop which leads to increasing loss of holding accuracy as the speed of gear tooth passage becomes slower, and therefore the detector has a minimum gear tooth speed at which accurate detection is possible.

The changes in the ambient magnetic field and corresponding changes in the transducer voltage caused by the passing of magnetic articles tend to vary. Most such proximity detectors of the prior art produce a high binary output voltage indicating proximity of a passing article, and produce a low binary voltage when the article recedes from the detector.

The transition in detector output voltage form low to high typically is triggered by a comparator that determines when the transducer voltage rises to equal a fixed internal threshold voltage reference, or in the case of the above described slope-activated sensor, determines when a transducer voltage peak has just occurred and the signal voltage drops a predetermined incremental voltage from the peak value.

These prior art proximity detectors, having fixed threshold voltages, produce a low to high (or high to low) output voltage that corresponds to different locations in the transducer voltage waveform when there are changes in the amplitude of the transducer voltage.

The sources of such changes in transducer voltage amplitude are many. For example, gear teeth (articles) may have different ferromagnetic properties from tooth to tooth and undulating changes in the spacings (air gap) gear teeth to detector caused by eccentricity of the gear. Also, changes in temperature can cause changes in air gap dimensions and in the sensitivity of the transducer and transducer-voltage amplifier. Furthermore, the magnetic-field-to voltage transducer in a proximity detector typically includes an internal DC offset voltage that varies with mechanical stresses and temperature variations.

Such changes in the transducer voltage therefore cause shifts in the timing of proximity detection relative to the actual distances of article approach and receding at which these transducer voltages exceed or fall below the fixed thresholds. This results in loss of accuracy in proximity detection that has become less and less tolerable especially when employed for detection of the rotational position of a gear by sensing the proximity of the gear teeth.

It is an object of this invention to provide a proximity sensor that generates a binary output voltage wherein the transitions accurately correspond to a definite point of approach and a definite point of receding of a passing magnetic article.

It is a further object of this invention to provide a magnetic article proximity detector that periodically determines when the amplitude of the magnetic-field-to-voltage transducer voltage has changed significantly, and adjusts the detection threshold as needed to be essentially a predetermined constant percentage of the peak to peak value of a changing detector-transducer-voltage amplitude.

SUMMARY OF THE INVENTION

A method for detection of passing magnetic articles includes the initial step of sensing the ambient magnetic field.

At the beginning of each of a succession of update time intervals, a voltage, Vsig, is generated that is proportional to the magnetic field and a signal voltage $V_{Pold}$ is generated that is equal to the first positive peak in Vsig. The voltage $V_{Pold}$ is then held. The method further includes the steps of generating a signal voltage $V_{Pnew}$ that is equal to the last positive peak voltage in Vsig, at the end of each of the update time intervals, and holding the voltage $V_{Pnew}$, and at the end of each update time interval, generating a high binary window-comparator output voltage Vupdt, when $V_{Pnew}$ lies outside the range $V_{Pold}-\Delta v$ to $V_{Pold}+\Delta v$, where $\Delta v$ is an incremental DC bias voltage;

Similar steps relating to negative going portions of Vsig include generating a signal voltage $V_{Nold}$ that is equal to the first negative peak in Vsig, at the beginning of each of a succession of update time intervals, holding the voltage $V_{Nold}$, generating a signal voltage $V_{Nnew}$ that is equal to the last negative peak voltage in Vsig, at the end of each of the update time intervals, and holding the voltage $V_{Nnew}$, and at the end of each update time interval, generating a high binary window-comparator output voltage, Vupdt, when $V_{Nnew}$ lies outside the range $V_{Nold}-\Delta v$ to $V_{Nold}+\Delta v$, where $\Delta v$ is an incremental DC bias voltage.

The subsequent steps include generating threshold voltages $V_{Pth}$ and $V_{Nth}$, during the next update time interval, that are proportional to the difference voltage, $V_{Pnew}-V_{Nnew}$, and generating a proximity-detector binary output voltage that becomes low when Vsig falls below (more negative than) $V_{Pth}$ and that becomes high when Vsig rises above (more positive than) $V_{Nth}$.

This has the great advantage when operating in threshold mode as described above, that the proximity sensor provides a binary output voltage wherein the transitions correspond more accurately to a definite point of approach and point of receding of a passing magnetic article.

BRIEF DESCRIPTION OF THE DRAWINGS

FIGS. 1 and 2 are drawn to the same scale.

FIG. 6 shows a few periods of the transducer signal Vsig in which an update interval terminates at $t_{update}$ and a successive update interval begins.

FIGS. 7, 8, 9, 10, 11 and 12 show, for the proximity detector of FIG. 1, the waveforms respectively of the latch signal, the reset signal, Vpcomp, Vncomp, Q33b, and the proximity-detector output signal Vout, all drawn to the time scale corresponding to that of FIG. 6.

DESCRIPTION OF PREFERRED EMBODIMENTS

Figure 1:
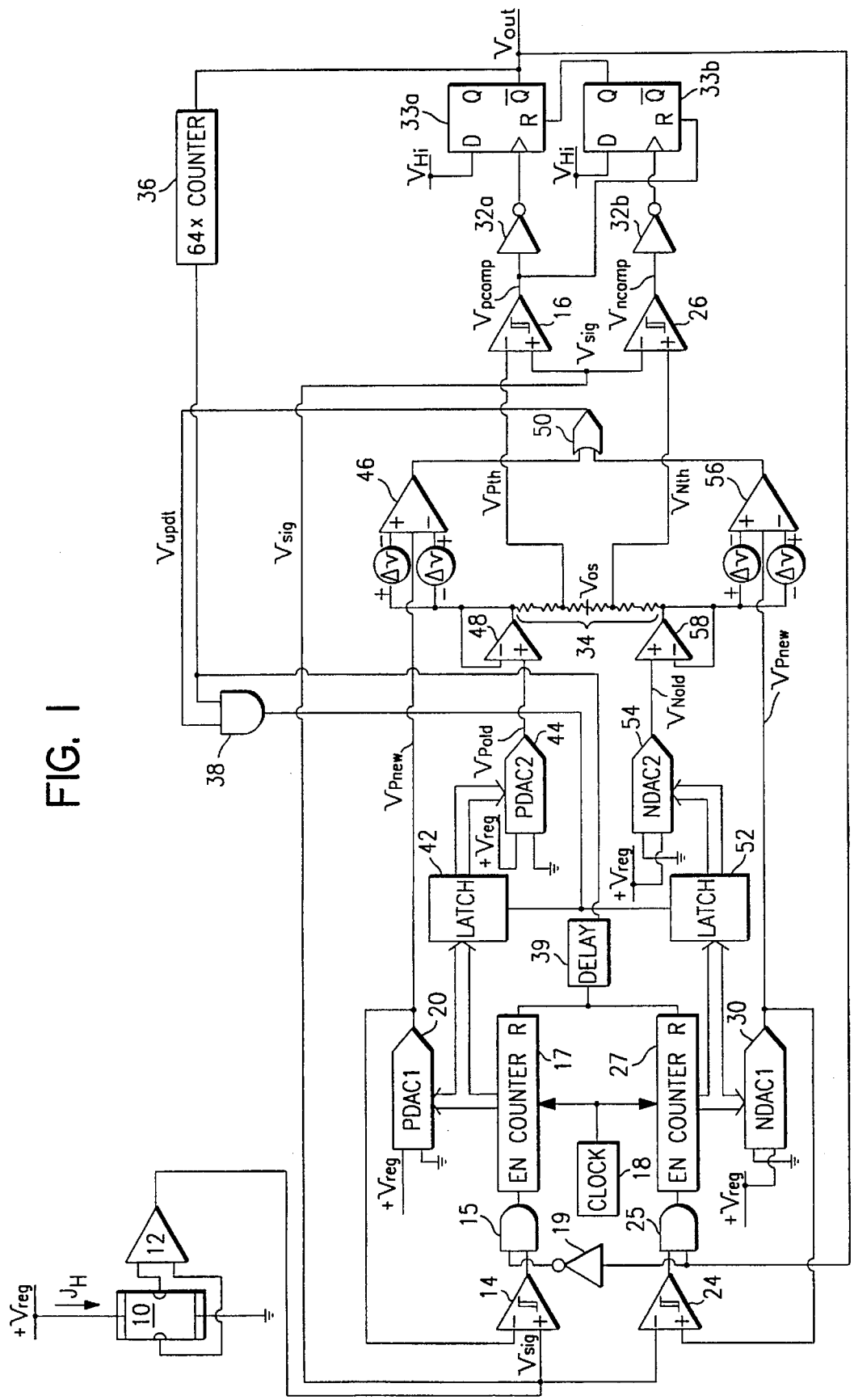
FIG. 1 shows a block diagram of a first magnetic-article proximity detector of this invention.

The Hall element 10 of FIG. 1 is energized by a current $I_H$ and has an output connected to the input of a Hall voltage amplifier 12. Hall element 10 may mounted at a pole of a magnet (not shown), so that when a ferrous article approaches, the Hall voltage $V_H$ and the amplified Hall voltage Vsig increase (or decrease); and when the article recedes, $V_H$ and Vsig decrease (or increase depending on the polarity of the magnet pole). Alternatively, the sensor circuit of FIG. 1 may be used to detect magnetic articles that themselves are magnetized, in which case the Hall element need not be mounted adjacent a magnet.

A magneto resistors bridge (not shown) may be substituted for the Hall element. And two Hall elements with their outputs connected differentially to the input of the Hall voltage amplifier (not shown) represents a second alternative magnetic-field-to-voltage transducer.

The amplified Hall voltage Vsig is manipulated by the remaining circuits in the proximity detector of FIG. 1 to produce a binary square wave output signal, Vout, that like a shadow graph reflects the profile of the passing articles.

Figure 2:
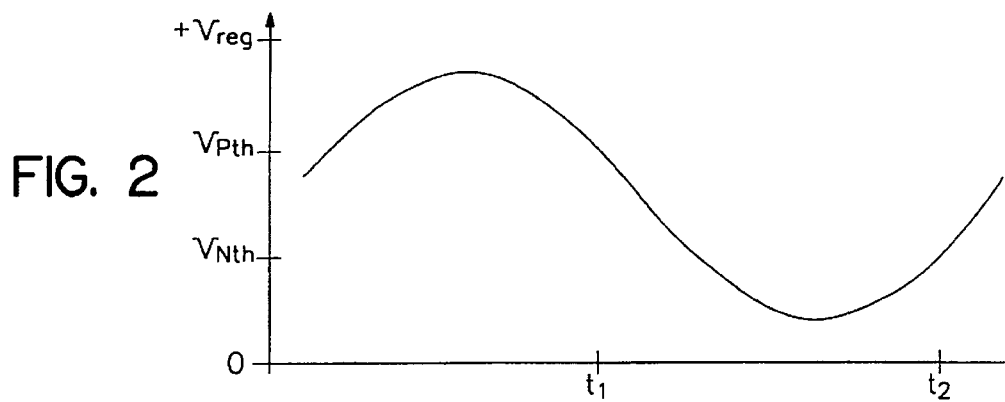
FIG. 2 shows a waveform of the Hall voltage, Vsig, in the circuit of FIG. 1 which waveform corresponds to the ambient magnetic field at the passage of one ferrous gear tooth (or other magnetic article).
Figure 3:
FIG. 3 shows the waveform of the output signal, Vout, from the proximity detector of FIG. 1, corresponding in time to the Hall voltage waveform of FIG. 2.

Referring also to FIGS. 2 and 3, and further to FIGS. 6 and 9, the amplified Hall voltage Vsig is applied to the positive input of a first comparator 14 via AND gate 15, and is also applied to the positive input of one second comparator 16 and to the negative input of another second comparator 26 which generate Vpcomp and Vncomp respectively (FIGS. 9 and 10). A composite latch, composed of the invertors 32a and 32b and the clocked flip flops 33a and 33b for producing an intermediate signal Q33b (FIG. 11) and proximity-detector output voltage Vout (FIG. 12).

During each positive going portion of Vsig, the voltage Vsig falls from the positive peak and at time $t_1$ goes below the threshold reference voltage $V_{Pth}$, produced at a tap in the resistive voltage divider 34. At times $t_1$, the output $V_{pcomp}$ of comparator 16 goes from a binary high to a low level as in FIG. 9, and Vout goes from a high to a low level as seen in FIG. 12.

During each negative going portion of Vsig, the voltage Vsig rises from the negative peak and at time $t_2$ goes above the threshold reference voltage $V_{Nth}$, produced at low tap in the resistive voltage divider 34. At times $t_2$, the output $V_{ncomp}$ of comparator 16 goes from a binary low to a high as in FIG. 10, and Vout goes from a low to a high level as seen in FIG. 12.

Assuming, as a starting point, that the counter 17 is at zero count, when the output of the first comparator 14 goes high the counter 17 begins counting the clock pulses from clock 18. The resulting count is presented to the digital-to-analog converter (PDAC1) 20 which produces an output analog voltage $V_{Pnew}$ always lying somewhere within the range from zero to the DC supply voltage, +Vreg. At any instant the amplitude of $V_{Pnew}$ is a direct linear function of the count signal from counter 17. When power is first applied to the detector circuit, a logic block (not shown) senses the time of turning on of the DC supply voltage, +Vreg, and resets the counters to zero count.

Figure 4:
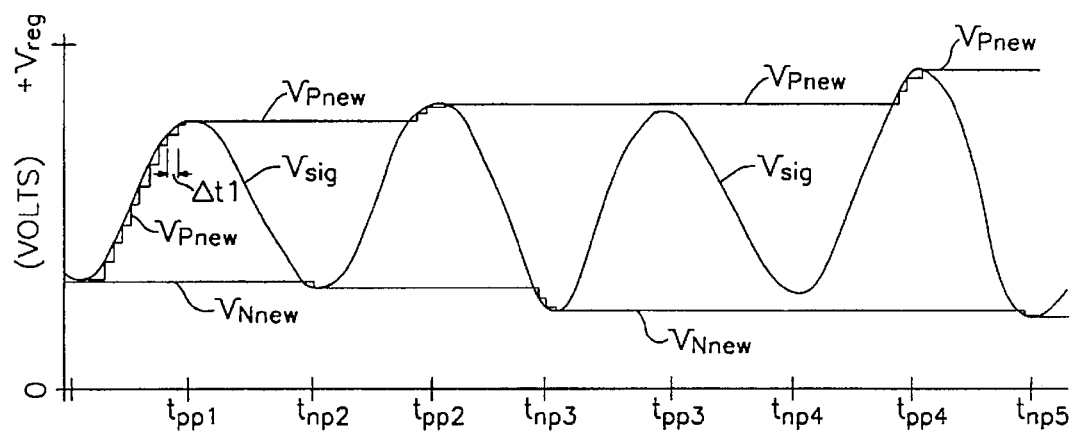
FIG. 4 shows a waveform of signal, Vsig, attributable to the passing of a plurality of magnetic articles that generate uneven amplitudes from one to the other in the ambient magnetic field. Shown superimposed on Vsig are the simultaneously generated DAC output voltages $V_{Pnew}$ and $V_{Nnew}$.

The comparator 14 has hysteresis and so is a Schmitt type comparator. The output of the DAC 20 (PDAC1) is connected to the negative input of the comparator 14 so that whenever Vsig becomes greater than voltage $V_{Pnew}$ plus the small hysteresis threshold voltage $V_{hys1}$ of the comparator 14 then the comparator 14 output goes high. If at that time Vout is low, then the output of AND gate 15 goes high and the counter 17 is enabled and counting. When Vsig is growing more positive, $V_{Pnew}$ is caused to track Vsig in stair step fashion, as is illustrated in FIG. 4. The incremental vertical excursions of the stair stepped $V_{Pnew}$ are equal to $Vreg/2^n$, where n is the number of DAC bits. The incremental horizontal times, $\Delta t1$, increase as the slope of Vsig decreases.

As is illustrated in FIG. 4, when a peak positive voltage of Vsig is reached, the counter 17 stops counting (e.g. at time $t_{pp1}$) and $V_{Pnew}$ holds this peak voltage until at a subsequent positive pulse in the signal Vsig that is greater than the held voltage $V_{Pnew}$. $V_{Pnew}$ again begins to track the subsequent positive pulse to its peak and to hold (e.g. at time $t_{pp2}$) that new peak voltage.

An update counter 36 is a six bit counter which counts the low-to-high transitions in the proximity-detector output signal Vout. When at time $t_{update}$, 64 positive pulses have been counted, counter 36 wraps and starts again from zero count to count the ensuing positive pulses. Referring to FIGS. 5, 5a, 6, 7 and 8, at $t_{update}$ the output of the update counter 36 goes high, counter 17 (and counter 27) is (are) reset via the delay circuit 39, and latches 42 and 52 are enabled.

Thus at the end of each update time interval of 64 counts, the PDAC1 output voltage $V_{Pnew}$ holds the positive peak voltage of the highest positive pulse in the signal Vsig. The most recent maximum peak positive voltage in Vsig is accordingly updated at the end of each update time interval of a predetermined number of pulses of one polarity in Vsig. The predetermined number in this example was set at 64 positive peaks and the counter 36 is accordingly a six bit counter, but this number is not critical.

At the end of each count 64, the output of the update counter 36 goes high to enable the update AND gate 38. If the update signal, Vupdt, is simultaneously high, the output of the update AND gate 38 goes high and enables the latch 42. Latch 42 holds the count in counter 17 during the following update time interval (of 64 pulses in Vsig). That count is applied to the input of PDAC2 44 during that update time interval. PDAC2 44 generates at its output an analog signal $V_{Pold}$ that is equal to the initial amplitude of Vsig at the beginning of the update time interval.

A window comparator 46 has a reference-voltage input connected to the output of PDAC1 20. The output signal $V_{Pold}$ from PDAC2 is applied via a unity gain buffer stage 48 to one end of the resistor voltage divider 34. And from there the signal $V_{Pold}$ is applied to the plus and minus inputs of the window comparator 46 via respectively the additive and subtractive DC bias voltages $\Delta v$.

Figure 5:
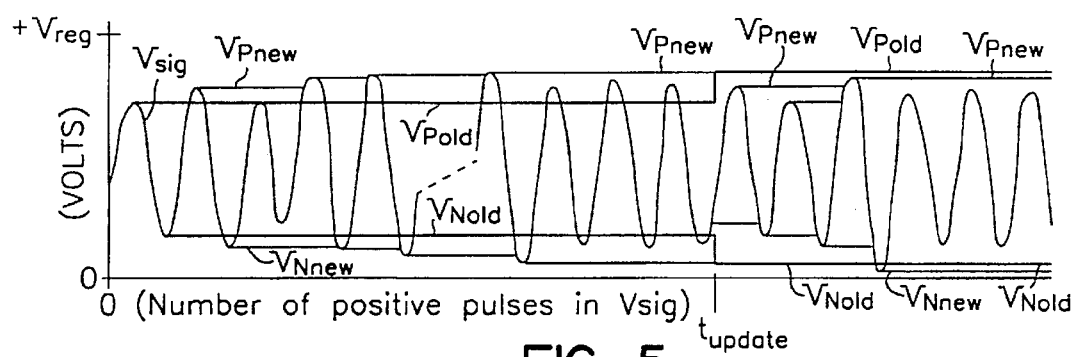
FIG. 5 shows a waveform of Vsig during one update interval of 64 pulses in Vsig and during a portion of a succeeding update interval, wherein the peak positive and negative values in Vsig are changing. Superimposed on Vsig are the DAC voltages $V_{Pnew}$ and $V_{Nnew}$, in the one interval and $V_{Pnew}$ and $V_{Nnew}$ in the succeeding update interval.
Figure 5A:
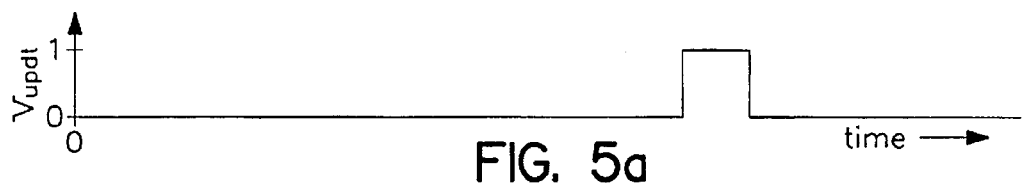
FIG. 5a shows a waveform of the update signal, Vupdt, drawn the scale as is FIG. 5.

Referring to FIG. 5, at the end of an update time interval, time $t_{update}$, the output of window comparator 46 goes high only if $V_{Pnew}$ lies outside of the range from $V_{Pold}+\Delta$ and $V_{Pold}-\Delta$. If at the end of an update interval, $V_{Pnew}$ is higher than or lower than this range then the output of window goes high causing the output of OR gate 50 to go high. This in turn causes the output of AND gate 38 to go high, and causes latch 42 to latch in the current count in counter 17. As explained above this updates $V_{Pold}$, namely PDAC2 44 generates at its output an analog signal $V_{Pold}$ that is equal to the initial amplitude of Vsig at the beginning of the next update time interval.

If the current value of $V_{new}$, namely the maximum peak positive peak value of Vsig during an entire update time interval, is not outside of and lies within the range from $V_{Pold}+\Delta$ and $V_{Pold}-\Delta$ at the end of that update time interval, then the output of comparator 46 remains low and latch 42 will not be enabled.

A lower circuit portion in the proximity detector of FIG. 1 essentially mirrors the construction of the upper portion just described. The lower circuit portion manipulates the negative pulses in Vsig in the same way as does the upper portion with respect to positive pulses in Vsig. Except for the holding of negative peaks in Vsig by NDAC1 30, latch 52 and NDAC2, there is no action going on in the lower circuit portion during positive going portions of Vsig.

For example, the output of comparators 24 and 26 go high only when Vsig goes negative. Thus only when Vsig is going negative are there changes of state in the signals of AND gate 25, counter 27, NDAC1 30, latch 52, NDAC2 54, buffer 58 and window comparator 56. The upper (P) and lower (N) portions of the circuit share the clock 18, the reset delay circuit 39 and the OR gate 50. It should be noted that the DC reference voltages +Vreg and ground are connected to NDAC1 30 and NDAC2 54 inversely with respect to those connections to PDAC1 20 AND PDAC2 44.

Thus instead of the output voltage going up as the count increases (in counter 17) to the PDACs, the output voltage of the NDACs goes down as the count (in counter 27) goes up. Alternatively, the NDACS could have been connected to the DC reference voltages as are the PDACs if the counter 27 had been of the kind that counts down from maximum count. Also, the counters 17 and 27 are of the kind that include an anti-overflow feature that prevents wrapping of the count when maximum count is exceeded, whereas counter 36 is of the simple kind that does wrap.

The resistive voltage divider 34 is a component that bridges the upper and lower circuit portions.

The ends of voltage divider 34 are connected respectively to the outputs of buffer stages 48 and 58. The held signal $V_{Pold}$ is applied to the upper end and the held signal $V_{Nold}$ is applied to the lower end of voltage divider 34. At the resistance center (from which there are equal resistances to the two ends) a voltage Vos is generated which is equal to the center voltage between the held positive peak voltage (of Vsig) $V_{Pold}$ and the held negative peak voltage $V_{Nold}$. The threshold voltages $V_{Nth}$ and $V_{PNth}$ are shown respectively at about a third the way up and two thirds the way up the voltage divider 34.

It will now be appreciated that these threshold voltages $V_{Nth}$ and $V_{Pth}$ have been adjusted after every update time interval to remain at a fixed percentage of the peak to peak voltage of Vsig even when the peak voltages of Vsig vary and/or when the offset voltages included in Vsig vary.

Voltage divider 34 is made up of six equal resistance resistors, and The voltage Vos is 50% of the voltage Vreg. $V_{Pth}$ and $V_{Nth}$ are therefore set at 67% and 33% of Vreg. In general, $V_{Pth}$ may be taken at the center point in the voltage divider, or may be at a higher point between 50% and 100% of the difference voltage $V_{Pnew}-V_{Nnew}$. Likewise, $V_{Nth}$ may be at the center point in the voltage divider, namely at 50% of $V_{Pnew}-V_{Nnew}$, or may be at a lower point between 50% and 0% of the difference voltage $V_{Pnew}-V_{Nnew}$. The thresholds $V_{Pth}$ and $V_{Nth}$ may be other than equal magnitudes from center voltage Vos, i.e. non symmetrical.

In any case, these threshold values vary with time and are always a fixed percentage of the current (updated) peak to peak difference voltage in the signal (Vsig). This has the great advantage when operating in threshold mode as described above, that the proximity sensor provides a binary output voltage wherein the transitions correspond more accurately to a definite point of approach and point of receding of a passing magnetic article.

We claim:

1. A method for detection of passing magnetic articles comprising:
   a) sensing an ambient magnetic field and generating a voltage, Vsig, that is proportional to the magnetic field;
   b) generating threshold voltages $V_{Pth}$ and $V_{Nth}$ that are respectively fixed percentages of the peak to peak voltage in Vsig at the beginning of each of a succession of update time intervals, each of the update time intervals encompassing a plurality of positive peaks in Vsig; and
   c) generating a proximity-detector output voltage that becomes one binary level when Vsig rises to exceed $V_{Pth}$ and that becomes another binary level when Vsig falls to below $V_{Nth}$.

2. The detection method of claim 1 additionally comprising
   a) generating a signal voltage $V_{Pold}$ that is equal to the first positive peak in Vsig, at the beginning of each update time interval, and holding the voltage $V_{Pold}$ during the each update time interval;
   b) generating a signal voltage $V_{Pnew}$ that is equal to the highest positive peak voltage in Vsig during the each update time interval, and holding the voltage $V_{Pnew}$; and
   c) at the end of each update time interval, generating an update command pulse, when $V_{Pnew}$ lies outside the range $V_{Pold}-\Delta v$ to $V_{Pold}+\Delta v$, where $\Delta v$ is an incremental DC bias voltage.

3. The detection method of claim 2 additionally comprising
   a) generating a signal voltage $V_{Nold}$ that is equal to the first negative peak in Vsig, at the beginning of the each update time interval, and holding the voltage $V_{Nold}$ during the each update time interval;
   b) generating a signal voltage $V_{Nnew}$ that is equal to the lowest negative peak voltage in Vsig during the each update time interval, and holding the voltage $V_{Nnew}$; and
   c) at the end of each update time interval, generating an update command pulse when $V_{Nnew}$ lies outside the range $V_{Nold}-\Delta v$ to $V_{Nold}+\Delta v$, where $\Delta v$ is an incremental DC bias voltage.

4. The detection method of claim 3 additionally comprising, at the occurrence of each of the update command pulses, starting a new update time interval in which $V_{Pold}$ and $V_{Nold}$ are updated and held to the values respectively of the first positive peak excursion and the first negative peak excursion of Vsig in that succeeding update time interval.

5. A method for detection of passing magnetic articles comprising:

a) sensing an ambient magnetic field and generating a voltage, Vsig, that is proportional to the magnetic field;

b) generating threshold voltages $V_{Pth}$ and $V_{Nth}$ to be fixed percentages of the peak to peak voltage in Vsig at the beginning of each of a succession of update time intervals, each of the update time intervals encompassing a plurality of positive peaks in Vsig;

c) generating a binary proximity-detector binary output voltage that becomes high when Vsig rises to exceed $V_{Pth}$ and that becomes low when Vsig falls to below $V_{Nth}$;

d) generating a signal voltage $V_{Pold}$ that is equal to the first positive peak in Vsig, at the beginning of each update time interval, and holding the voltage $V_{Pold}$ during the each update time interval;

e) generating a signal voltage $V_{Pnew}$ that is equal to the highest positive peak voltage in Vsig during the each update time interval, and holding the voltage $V_{Pnew}$;

f) at the end of each update time interval, generating a binary voltage, Vupdt that is momentarily high when $V_{Pnew}$ lies outside the range $V_{Pold}-\Delta v$ to $V_{Pold}+\Delta v$, where $\Delta v$ is an incremental DC bias voltage;

g) generating a signal voltage $V_{Nold}$ that is equal to the first negative peak in Vsig, at the beginning of the each update time interval, and holding the voltage $V_{Nold}$ during the each update time interval;

h) generating a signal voltage $V_{Nnew}$ that is equal to the lowest negative peak voltage in Vsig during the each update time interval, and holding the voltage $V_{Nnew}$;

i) at the end of each update time interval, generating a momentary high in the binary voltage, Vupdt, when $V_{Nnew}$ lies outside the range $V_{Nold}-\Delta v$ to $V_{Nold}+\Delta v$, where $\Delta v$ is an incremental DC bias voltage;

j) when at times $t_{update}$ the binary voltage Vupdt becomes momentarily high, starting a succeeding update time interval in which $V_{Pold}$ and $V_{Nold}$ are updated to the values respectively of the first positive peak excursion and the first negative peak excursion of Vsig in that succeeding update time interval.

* * * * *